United States Patent
Venca (10) Patent No.: US 11,811,311 B2
(45) Date of Patent: Nov. 7, 2023

(54) GATE CONTROLLER FOR A CHARGE PUMP CONVERTER

(71) Applicant: EM Microelectronic-Marin SA, Marin (CH)

(72) Inventor: Alessandro Venca, Hauterive (CH)

(73) Assignee: EM Microelectronic-Marin SA, Marin (CH)

( * ) Notice: Subject to any disclaimer, the term of this patent is extended or adjusted under 35 U.S.C. 154(b) by 3 days.

(21) Appl. No.: 17/770,098

(22) PCT Filed: Nov. 5, 2020

(86) PCT No.: PCT/EP2020/081172
§ 371 (c)(1),
(2) Date: Apr. 19, 2022

(87) PCT Pub. No.: WO2021/089720
PCT Pub. Date: May 14, 2021

(65) Prior Publication Data
US 2022/0393582 A1    Dec. 8, 2022

(30) Foreign Application Priority Data
Nov. 5, 2019   (EP) .................................... 19207239

(51) Int. Cl.
*H02M 3/07*    (2006.01)
*H02M 1/36*    (2007.01)
*H02M 3/28*    (2006.01)
*H02M 1/08*    (2006.01)

(52) U.S. Cl.
CPC .............. *H02M 3/07* (2013.01); *H02M 1/08* (2013.01); *H02M 1/36* (2013.01); *H02M 3/285* (2013.01)

(58) Field of Classification Search
CPC .......... H02M 3/07; H02M 3/285; H02M 1/08; H02M 1/36; H03K 17/145
See application file for complete search history.

(56) References Cited

U.S. PATENT DOCUMENTS

| | | | |
|---|---|---|---|
| 7,504,892 B1 * | 3/2009 | Pesucci ................. | H03L 7/0896 331/8 |
| 9,588,497 B1 * | 3/2017 | Monk ..................... | H03L 7/093 |
| 10,394,740 B1 * | 8/2019 | Guo ..................... | G06F 13/4022 |

(Continued)

OTHER PUBLICATIONS

International Search Report of PCT/EP2020/081172 dated Jan. 29, 2021 [PCT/ISA/210].

(Continued)

*Primary Examiner* — Sibin Chen
(74) *Attorney, Agent, or Firm* — Sughrue Mion, PLLC (57) ABSTRACT

Provided is a gate controller having a primary signal input which is AC coupled to the gate through a capacitor, one or more bias inputs each connected to the gate through a resistor such as to control the DC voltage bias of the gate and therefore the conductivity of the switching element. The bias inputs can be properly connected to internal nodes of the charge pump, or charge pump stages, such that the gate controller is self-biased, without using bias-reference external to the charge pump. The gate controller can be made programmable by using potentiometers in place of the bias resistors. The programmable gate controller stages can be connected to form a programmable gate controlled charge pump.

11 Claims, 8 Drawing Sheets

(56) References Cited

U.S. PATENT DOCUMENTS

2008/0100370 A1\* 5/2008 Chen .................... H02M 3/073
  327/536
2019/0334384 A1\* 10/2019 Yase ....................... H04B 5/02

OTHER PUBLICATIONS

Written Opinion of PCT/EP2020/081172 dated Jan. 29, 2021 [PCT/ISA/237].

\* cited by examiner

GATE CONTROLLER FOR A CHARGE PUMP CONVERTER

CROSS REFERENCE TO RELATED APPLICATIONS

This application is a National Stage of International Application No. PCT/EP2020/081172 filed on Nov. 5, 2020, claiming priority based on European Patent Application No. 19207239.5 filed on Nov. 5, 2019.

TECHNICAL FIELD

The present invention relates to the field of charge pump converter and in particular of a stage of charge pump converter. More specifically, this invention deals with gate controller for a charge pump converter stage.

STATE OF THE ART

Charge pump is well known in the art, however, the active device, and more particularly the transistor, in diode configuration, is not controllable and as a consequence the charge pump input impedance and efficiency are largely dependent on the active device threshold voltage which varies with process corners and temperature.

The present invention discloses a gate controller for a charge pump converter stage, to control the gate bias voltage of the active device in a charge pump such that the charge pump input impedance and efficiency are more constant across process and temperature variations.

SUMMARY OF THE INVENTION

The present invention relates to a charge pump converter stage comprising at least one primary gate controller and at least one secondary gate controller; said at least one primary gate controller comprises at least one;
  primary signal output: said at least one primary signal output is configured to be connected to an at least one second primary signal input of a charge pump converter stage and/or a first circuit;
  first primary signal input: said at least one first primary signal input is configured to receive a first control signal;
  primary bias input: said at least one primary bias input configured to establish a voltage value and/or a current value of said at least one primary gate controller;
  second primary signal input: said at least one second primary signal input configured to be connected to an at least one primary signal output of a charge pump converter stage and/or to receive a main signal, preferably from an antenna, from an integrated circuit, at least one primary signal and/or from a charge pump converter stage; and,
said at least one secondary gate controller comprises at least one:
  secondary signal output: said at least one secondary signal output is configured to be connected to an at least one second secondary signal input of a charge pump converter stage and/or a second circuit;
  first secondary signal input: said at least one first secondary signal input is configured to receive a second control signal;
  secondary bias input: at least one secondary bias input configured to establish a voltage value and/or a current value of said at least one secondary gate controller; and,
  second secondary signal input: said at least one second secondary signal input configured to be connected to an at least one secondary signal output of a charge pump converter stage and/or to receive said main signal, preferably from an antenna, from an integrated circuit, at least one secondary signal and/or from a charge pump converter stage;
said at least one first primary signal input is configured to be connected to said at least one secondary signal output and said at least one first secondary signal input is configured to be connected to said at least one primary signal output.

Thanks to the arrangement according to the invention, the charge pump converter stage allows adjusting the bias voltage of the gate by coupling the gate of the switching element to the output of the previous charge pump converter stage and said at least one bias input, which sets the DC gate's voltage reference bias.

More specifically, the present invention comprises a gate controller having a primary signal input, a gate, one or more bias input each connected to the gate through a resistor or a transistor such as to control the DC voltage bias of the gate and therefore the conductivity of the switching element.

Said bias inputs can be properly connected to internal nodes of the charge pump, charge pump stage, or charge pump converter stage, such that the gate controller is self-biased without using bias-reference external to the charge pump.

Said gate controller can be made programmable by using potentiometers in place of the bias resistors.

According to an embodiment, said charge pump converter stage comprises at least one primary attenuator; said at least one primary attenuator comprises at least one primary attenuator input, at least one primary attenuator output and a ground.

According to an embodiment, said at least one primary attenuator input is configured to be connected to said at least one first primary signal input and said at least one primary attenuator output is configured to be connected to said at least one secondary signal output.

Thanks to one of those the arrangements according to the invention, said at least one primary signal may be attenuated or amplified through said at least one primary attenuator.

According to an embodiment, said charge pump converter stage comprises at least one secondary attenuator; said at least one secondary attenuator comprises at least one secondary attenuator input, at least one secondary attenuator output and a ground or said ground.

According to an embodiment, said at least one secondary attenuator input is configured to be connected to said at least one first secondary signal input and said at least one secondary attenuator output is configured to be connected to said at least one primary signal output.

Thanks to one of those the arrangements according to the invention, said at least one secondary signal may be attenuated or amplified through said at least one secondary attenuator.

According to an embodiment, said charge pump converter stage comprises at least one primary trim input configured to trim said at least one primary attenuator and/or said at least one secondary attenuator, and/or at least one secondary trim input configured to trim said at least one primary attenuator and/or said at least one secondary attenuator.

Thanks to the arrangement according to the invention, the attenuation or the amplification of said at least one primary signal and/or said at least one secondary signal may be trimmed through said at least one first secondary trim input and/or said at least one second secondary trim input.

According to an embodiment, said at least one primary attenuator comprises at least one first primary capacitor connected between said at least one primary attenuator input and said at least one primary attenuator output, and at least one second primary capacitor connected between said at least one primary attenuator output and said ground, and/or said at least one secondary attenuator comprises at least one first secondary capacitor connected between said at least one secondary attenuator input and said at least one secondary attenuator output, and at least one second secondary capacitor connected between said at least one secondary attenuator output and said ground.

According to an embodiment, said at least one primary trim input is configured to control the capacitance of said at least one second primary capacitor and/or the capacitance of said at least one second secondary capacitor.

According to an embodiment, said at least one secondary trim input is configured to control the capacitance of said at least one first primary capacitor and/or the capacitance of said at least one first secondary capacitor.

Thanks to one of those the arrangements according to the invention, the control on the K factor is made by trimming the values of said at least one first primary capacitor, said at least one second primary capacitor, said at least one first secondary capacitor and/or said at least one second secondary capacitor in said charge pump converter stage. Indeed, since it exists an optimal k-factor for each process and temperature, the charge pump converter stage efficiency can be in this way maximized over process and temperature.

According to an embodiment, said at least one primary gate controller comprises at least one primary switching element having a primary conduction path with a first primary terminal and a second primary terminal, and a primary gate configured to control the current flowing through said primary conduction path, said primary conduction path being configured to provide said at least one primary signal; said primary gate is configured to be connected to said at least one first primary signal input and to said at least one primary bias input, and/or wherein said at least one secondary gate controller comprises at least one secondary switching element having a secondary conduction path with a first secondary terminal and a second secondary terminal, and a secondary gate configured to control the current flowing through said secondary conduction path, said secondary conduction path being configured to provide said at least one secondary signal; said secondary gate is configured to be connected to said at least one first secondary signal input and to said at least one secondary bias input.

Thanks to the arrangement according to the invention, the charge pump converter stage allows adjusting the bias voltage of the gate by coupling the gate of the switching element to the output of the previous charge pump converter stage and said at least one bias input, which sets the DC gate's voltage reference bias.

According to an embodiment, said at least one primary bias input comprises a plurality of primary bias current flow controller comprising at least one first primary bias current flow controller and/or at least one first primary bias transistor and/or wherein said at least one secondary bias input comprises a plurality of secondary bias current flow controller comprising at least one first secondary bias current flow controller and/or at least one first secondary bias transistor.

Thanks to the arrangements according to the invention, the conduction path of the switching element may be controlled.

According to an embodiment, said at least one primary bias input is configured to be connected to said at least one second primary signal input, and/or said at least one secondary bias input is configured to be connected to said at least one second secondary signal input.

Thanks to the arrangements according to the invention, the conduction path of the switching element may be controlled.

The present invention relates to a charge pump converter comprising a plurality of charge pump converter stages including at least one first charge pump converter stage according to any precedent claims, and a second charge pump converter stage according to any precedent claims; said at least one first primary signal input of said at least one first charge pump converter stage is directly connected to said at least one first primary signal input of said at least one second charge pump converter stage, said at least one first secondary signal input of said at least one first charge pump converter stage is directly connected to said at least one first secondary signal input of said at least one second charge pump converter stage, said at least one primary signal output of said at least one first charge pump converter stage is directly connected to said at least one second primary signal input of said at least one second charge pump converter stage, said at least one secondary signal output of said at least one first charge pump converter stage is directly connected to said at least one second secondary signal input of said at least one second charge pump converter stage.

Thanks to the arrangements according to the invention, the charge pump converter stages are linked together.

According to an embodiment, said at least one primary trim input is configured to control the capacitance of said at least one second primary capacitor of said first charge pump converter stage, the capacitance of said at least one second secondary capacitor of said second charge pump converter stage, the capacitance of said first charge pump converter stage, and/or the capacitance of said second charge pump converter stage.

According to an embodiment, said at least one secondary trim input is configured to control the capacitance of said at least one first primary capacitor of said first charge pump converter stage, the capacitance of said at least one first secondary capacitor of said second charge pump converter stage, the capacitance of said first charge pump converter stage, and/or the capacitance of said second charge pump converter stage.

Thanks to one of those the arrangements according to the invention, the control on the K factor is made by trimming the values of said at least one first primary capacitor, said at least one second primary capacitor, said at least one first secondary capacitor and/or said at least one second secondary capacitor in said charge pump converter stage. Indeed, since it exists an optimal k-factor for each process and temperature, the charge pump converter stage efficiency can be in this way maximized over process and temperature.

BRIEF DESCRIPTION OF THE DRAWINGS

The foregoing and other purposes, features, aspects and advantages of the invention will become apparent from the following detailed description of the embodiments, given by way of illustration and not limitation with reference to the accompanying drawings, in which.

DESCRIPTION OF THE INVENTION

Specific embodiments of the invention will now be described in detail with reference to the accompanying figures. Like elements in the various figures are denoted by like reference numerals for consistency. Further, the use of "Fig." will be equivalent to the use of "figure" in the description.

In the following description of the embodiments of the invention numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1:
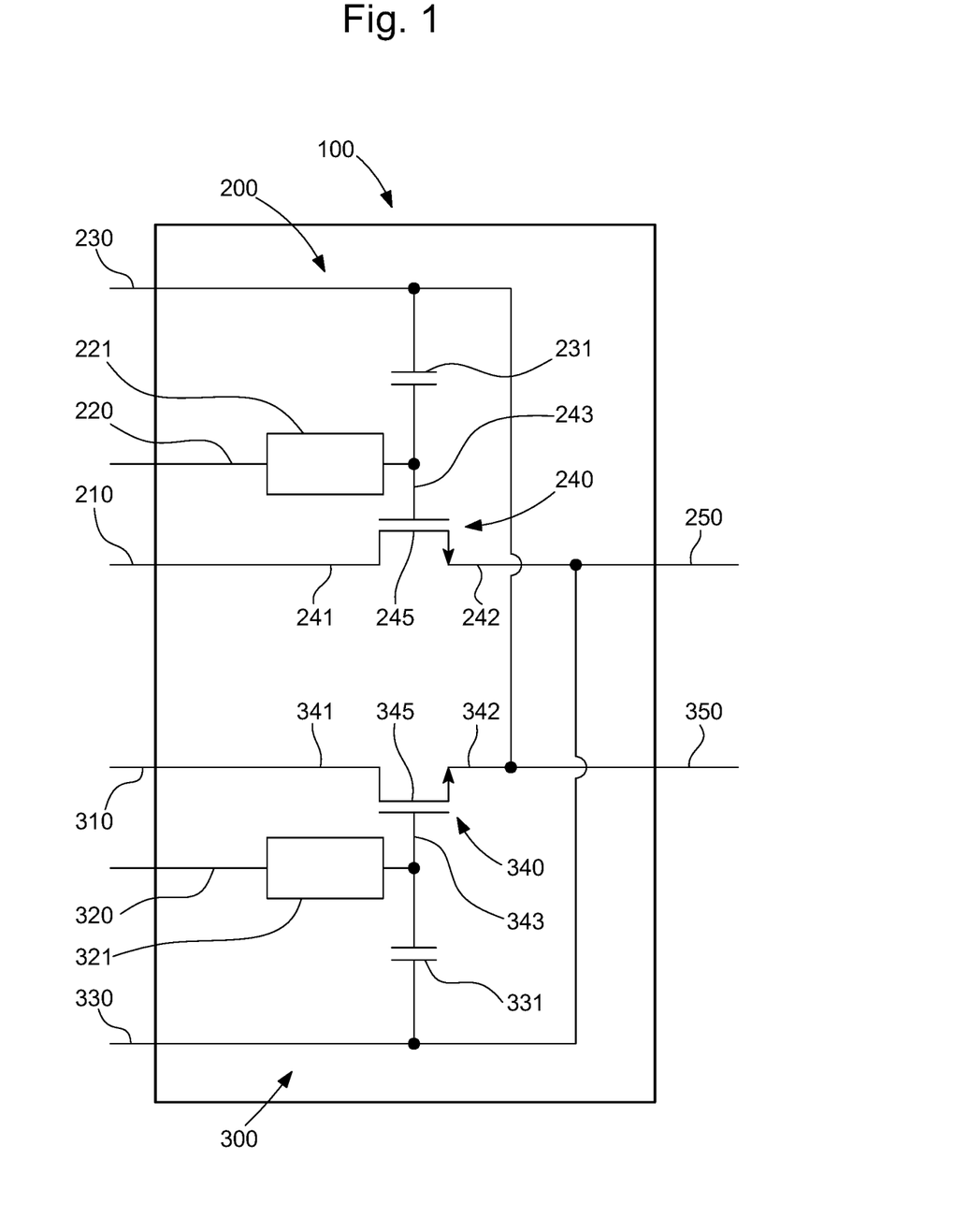
FIGS. 1 and 2 represent a charge pump converter stage 100 according to an embodiment of the present invention.

The present invention relates to a charge pump converter stage 100 comprising at least one primary gate controller 200 and at least one secondary gate controller 300 as depicted in FIG. 1. Said at least one primary gate controller 200 may comprise at least one primary signal output 250, at least one first primary signal input 230, at least one primary bias input 220 and at least one second primary signal input 210.

Said at least one primary signal output 250 may be connected in series to a first circuit and/or an at least one second primary signal input 210 of a charge pump converter stage 100. Indeed, said at least one second primary signal input 210 may be connected to, preferably directly connected to an at least one primary signal output 250 of a following charge pump converter stage 100 and/or to receive a main signal, preferably from an antenna, from an integrated circuit and/or from a charge pump converter stage 100, and said at least one first primary signal input 230 may receive a first control signal and said at least one primary bias input 220 may establish a voltage value and/or a current value of said at least one primary gate controller 200.

Figure 7:
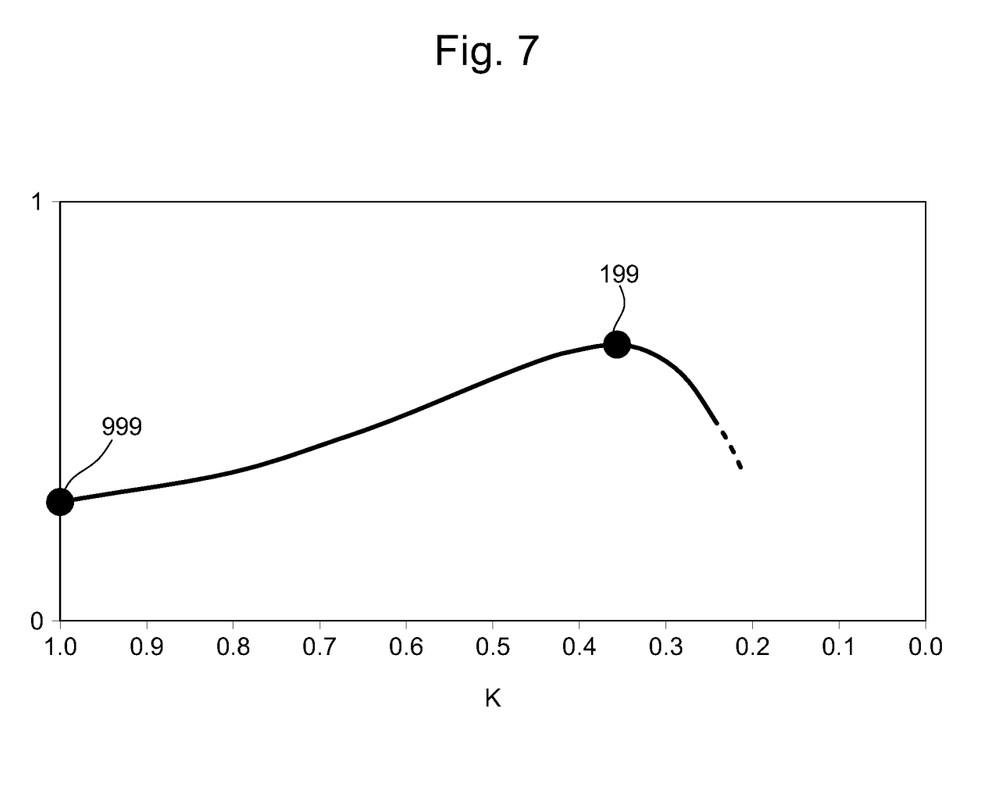
FIG. 7 depicts at least one primary gate controller efficiency or at least one secondary gate controller efficiency as a function of the K factor; and, FIG. 8 illustrates a charge pump converter comprising a plurality of a charge pump converter stage 100.

Further, said at least one primary gate controller 200 may comprise at least one primary switching element 240 having a primary conduction path 245 with a first primary terminal 241 and a second primary terminal 242, and a primary gate 243 configured to control the current flowing through said primary conduction path 245: said primary conduction path 245 may provide said at least one primary signal. By controlling, the skilled man in the art would understand that the current flowing through said primary conduction path 245 or said secondary conduction path 345 may be varied in amplitude, frequency, and/or in phase such as to be transmitted to another charge pump converter stage for instance as shown in FIG. 7.

Figure 2:
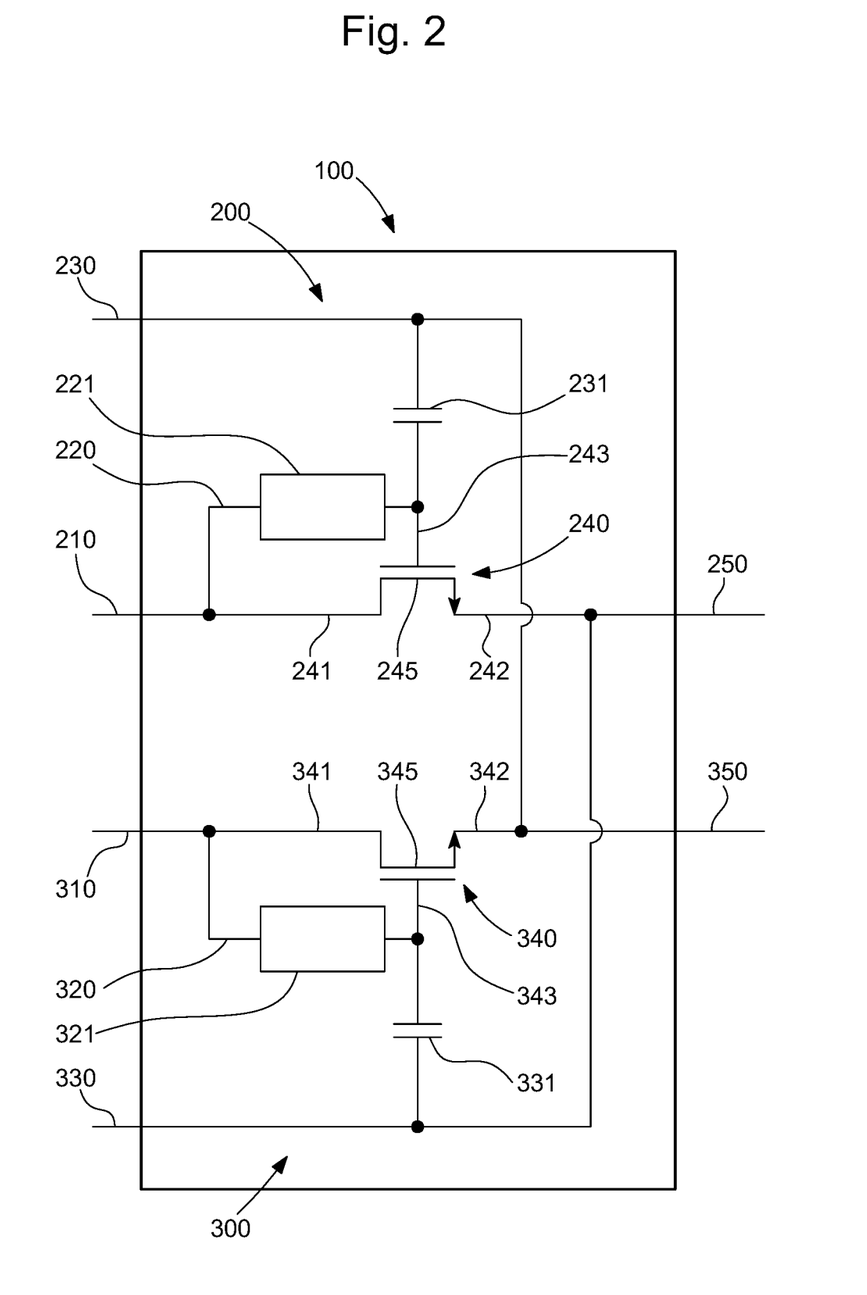

Said primary gate 243 may be also connected to, preferably directly connected to said at least one first primary signal input 230 preferably via at least one primary coupling capacitor 231 and to said at least one primary bias input 220 via at least one primary bias element 221, like at least one first primary bias current flow controller 221, as depicted in FIG. 2 for example. So, the charge pump converter stage allows adjusting the bias voltage of said primary gate 243 by coupling said primary gate 243 of the switching element to the output of the previous charge pump converter stage and/or said at least one bias input, which sets the DC gate's voltage reference bias.

Similarly to said at least one primary gate controller 200, said at least one secondary gate controller 300 may comprise at least one secondary signal output 350, at least one first secondary signal input 330, at least one secondary bias input 320 and at least one second secondary signal input 310. Said secondary gate 343 may be also connected to, preferably directly connected to said at least one first secondary signal input 330 preferably via at least one secondary coupling capacitor 331 and to said at least one secondary bias input 320 via at least one secondary bias element 321, like at least one first secondary bias current flow controller 321, as depicted in FIG. 2 for example.

Said at least one secondary signal output 350 may be connected in series to a second circuit an at least one second secondary signal input 310 of a charge pump converter stage 100. Indeed, said at least one second secondary signal input 310 may be connected to, preferably directly connected to an at least one secondary signal output 350 of a following charge pump converter stage 100 and/or to receive said main signal, preferably from an antenna, from an integrated circuit and/or from a charge pump converter stage 100, and said at least one first secondary signal input 330 may receive a second control signal, and said at least one secondary bias input 320 may establish a voltage value and/or a current value of said at least one secondary gate controller 300. As shown in FIG. 1, said at least one first primary signal input 230 may be connected to, preferably directly connected to said at least one secondary signal output 350 and said at least one first secondary signal input 330 may be connected to, preferably directly connected to said at least one primary signal output 250.

Further, said at least one secondary gate controller 300 may comprise at least one secondary switching element 340 having a secondary conduction path 345 with a first secondary terminal 341 and a second secondary terminal 342, and a secondary gate 343 configured to control the current flowing through said secondary conduction path 345: said secondary conduction path 345 may provide said at least one secondary signal.

Said secondary gate 343 may be also configured to be connected to, preferably directly connected to said at least one first secondary signal input 330, via at least one secondary coupling capacitor 331, and to said at least one secondary bias input 320. So, the charge pump converter stage allows adjusting the bias voltage of said secondary gate 343 by coupling the said secondary gate 343 of the switching element to the output of the previous charge pump converter stage and said at least one bias input, which sets the DC gate's voltage reference bias.

In order to adjust the bias voltage of the gates 243, 343, the gates 243, 343 of the switching elements in said at least one primary gate controller 200 and said at least one secondary gate controller 300 may be coupled to the output of the previous charge pump converter stage and/or said at least one bias input 220, 320, which sets the DC gate's voltage reference bias. More specifically, the present invention may comprise said at least one primary gate controller 200 and said at least one secondary gate controller 300 having said primary gate 243, said at least one primary bias input 220 connected to, preferably directly connected to said primary gate 243 through a bias element like a resistor or a transistor and said secondary gate 343, said at least one secondary bias input 320 connected to, preferably directly connected to said secondary gate 343 through at least one primary bias element 221 and/or at least one secondary bias element 321 like a resistor or a transistor respectively such as to control the DC voltage bias of said primary gate 243 and said secondary gate 343 and therefore the conductivity of at least one primary switching element 240 and at least one secondary switching element 340 respectively. Said bias inputs, more precisely said at least one primary bias input 220 and said at least one secondary bias input 320 may be properly connected to, preferably directly connected to internal nodes of said charge pump converter stage 100 such that said at least one primary gate controller 200 and said at least one secondary gate controller 300 are self-biased without using bias-reference external to the charge pump. As it may be in FIG. 2, where said at least one primary bias input 220 may be directly connected to, preferably directly connected to said at least one second primary signal input 210, and said at least one secondary bias input 320 may be directly connected to, preferably directly connected to said at least one second secondary signal input 310.

As previously mentioned, said bias element may be a resistor or a transistor. Indeed, said at least one primary bias input 220 may comprise at least one first primary bias current flow controller 221, like at least one first primary bias transistor 221. In some embodiments not represented, said primary gate 243 may be connected to, preferably directly connected to said second primary terminal 242, rather said at least one primary signal output 250 via an at least one second primary bias current flow controller and/or at least one second primary bias transistor thus the primary conduction path 245 of the primary switching element 240 may be controlled. The same applies for the secondary switching element 340 with at least one first secondary bias current flow controller 221, like at least one first secondary bias transistor 221 and at least one second secondary bias current flow controller like at least one second secondary bias transistor.

The applicant does not exclude the gate voltage of said primary gate 243 may be determined by configuration of said at least one first primary bias current flow controller 221, like a resistor, and at least one second primary bias current flow controller, like a resistor, forming a resistive divider and the DC primary gate voltage may be comprised between the voltage value of said at least one second primary signal input 210 and of a second primary terminal 242. The same applies for the secondary switching element 340.

According to some embodiments not represented, instead of a resistor as said at least one first primary bias current flow controller 221 and/or as said at least one second primary bias current flow controller, a transistor and preferably by a MOS transistor may be used such as the primary conduction path 245 of the primary switching element 240 may be controlled and may make said charge pump converter stage 100 programmable and more specifically said at least one primary gate controller 200 programmable. The same applies for the secondary switching element 340.

Further, said at least one first primary bias transistor 221 may be trimmed such as to control the current flowing through and/or said at least one first primary bias transistor 221 and/or wherein said at least one second primary bias transistor may be trimmed such as to control the current flowing through said at least one first primary bias transistor 221. So, the primary conduction path 245 of the switching element 240 may be controlled which makes the charge pump converter programmable via an integrated circuit, a microcontroller and/or a processor. The same applies for the secondary switching element 340.

The applicant may want to have a linear control of said charge pump converter stage 100 programmable and more specifically said at least one primary gate controller 200 programmable a potentiometer and/or the digital potentiometer may replace said transistor and preferably said MOS transistor in linear with a controlled channel resistance. Since the plurality of primary bias current flow controller may comprise at least one first primary bias transistor 221 and at least one second primary bias transistor, the conduction path 245 of the primary switching element 240 may be linearly controlled and may make the charge pump converter programmable via an integrated circuit, a microcontroller and/or a processor. The same applies for the secondary switching element 340.

Moreover, since it exists an optimal k-factor for each process and temperature, in prior art, the charge pump efficiency 999 may vary uncontrollably as a function of temperature, for example. Whereas, the charge pump converter stage efficiency 199, see FIG. 7, according the invention, can be maximized for a given process and temperature. In order to achieve this, said charge pump converter stage 100 may comprise at least one primary attenuator 410 and/or at least one secondary attenuator 420.

Figure 3:
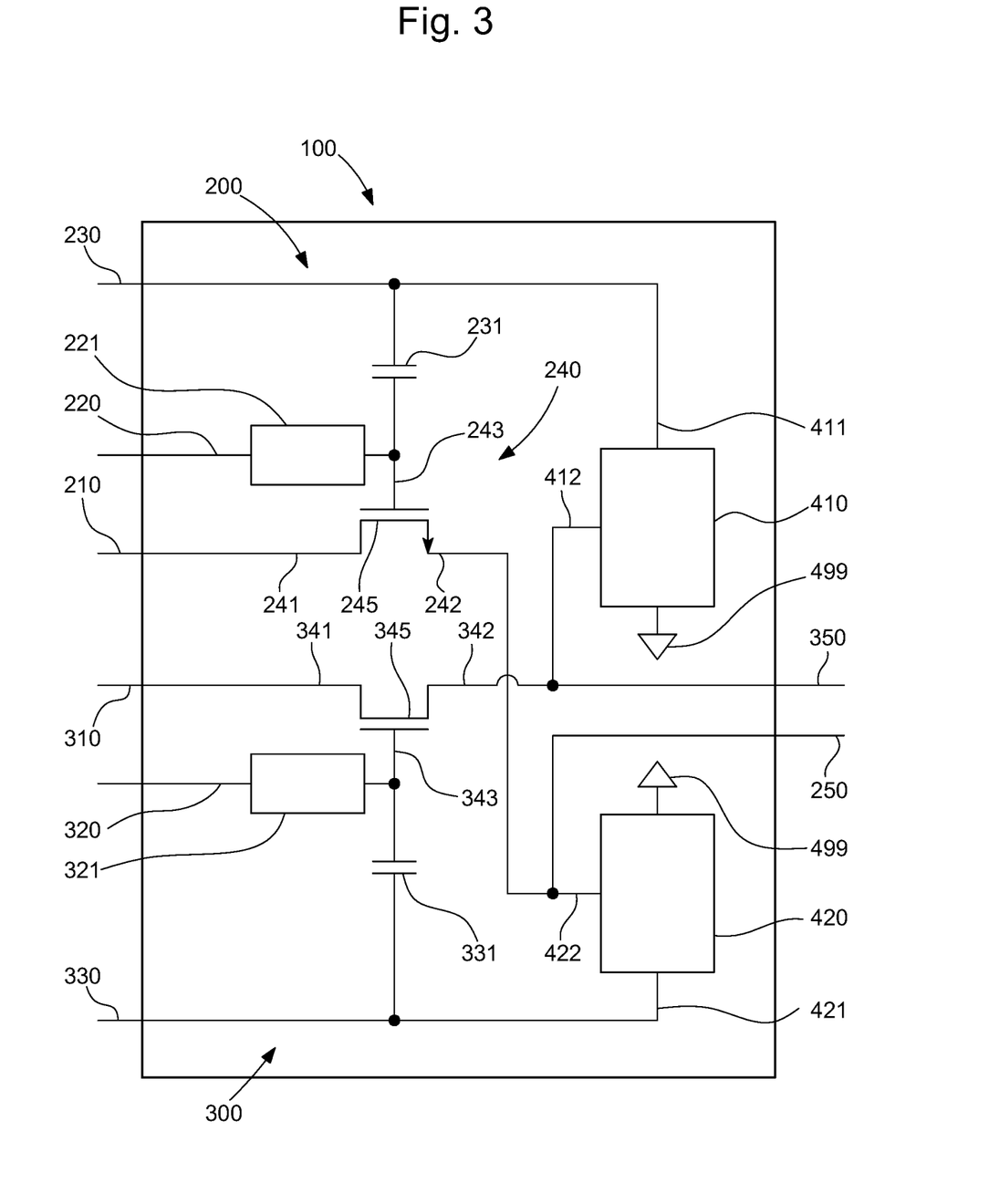
FIGS. 3 and 4 illustrate said charge pump converter stage 100 comprising at least one primary attenuator 410 and at least one secondary attenuator 420 according to an embodiment of the present invention.
Figure 4:
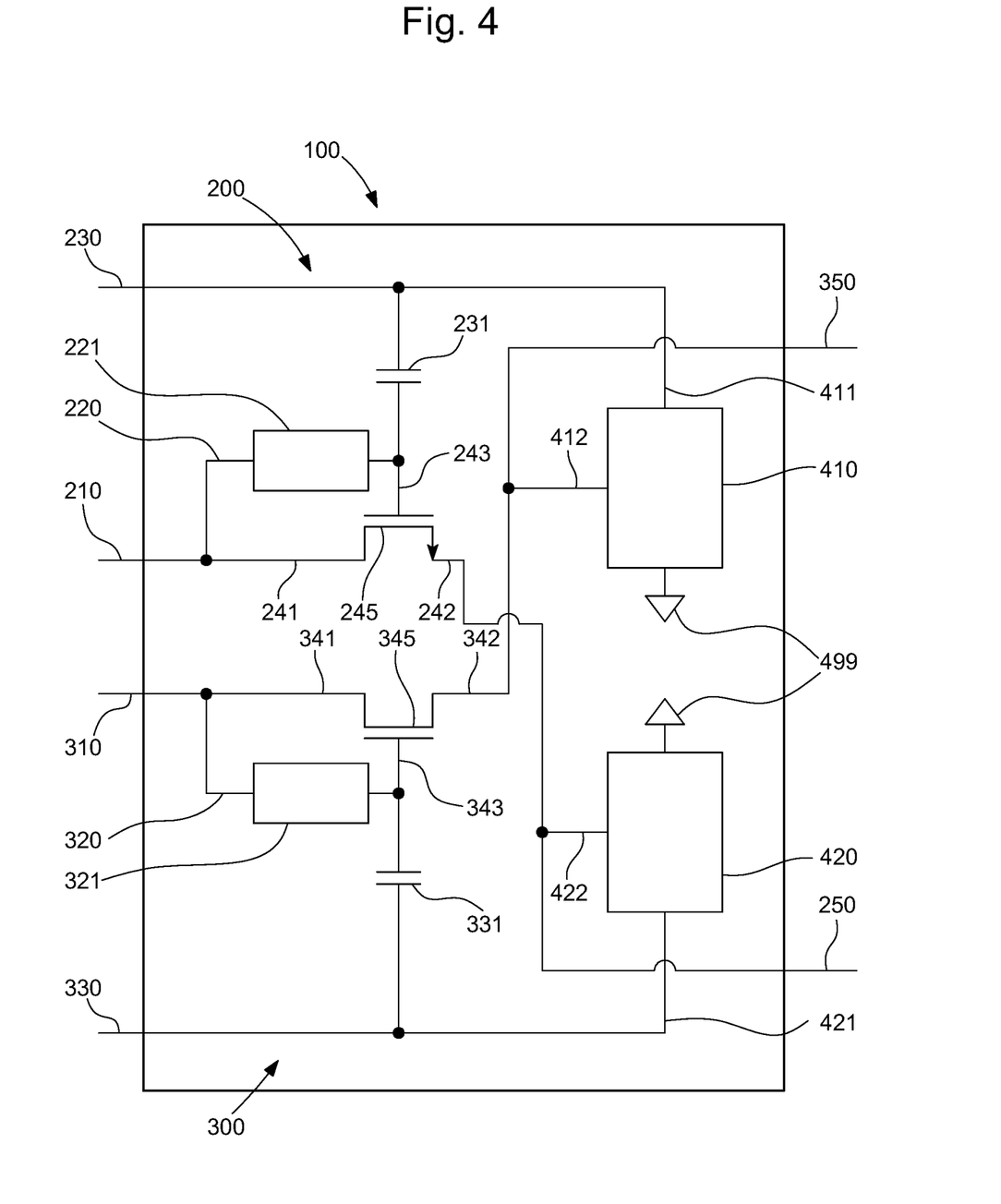

As illustrated in FIGS. 3 and 4, said at least one primary attenuator 410 may comprise a ground 499, at least one primary attenuator input 411 configured to be connected to, preferably directly connected to said at least one first primary signal input 230 and at least one primary attenuator output 412 configured to be connected to, preferably directly connected to said at least one secondary signal output 350, such as said at least one primary signal may be attenuated or amplified through said at least one primary attenuator 410.

Similarly, said charge pump converter stage 100 may comprise said ground 499, at least one secondary attenuator input 421 configured to be connected to, preferably directly connected to said at least one first secondary signal input 330 and at least one secondary attenuator output 422 configured to be connected to, preferably directly connected to said at least one primary signal output 250, such as said at least one secondary signal may be attenuated or amplified through said at least one secondary attenuator 420.

Figure 5:
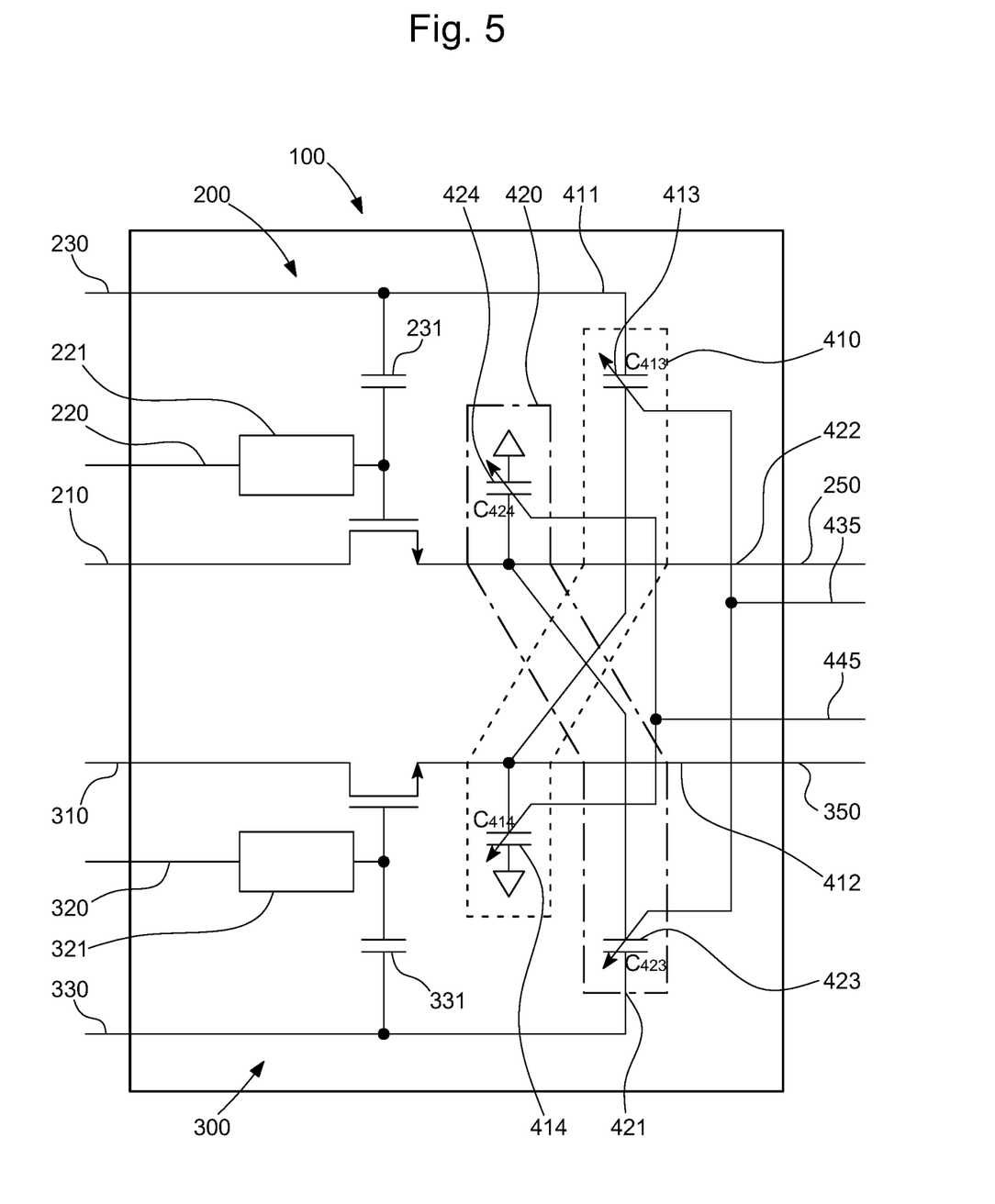
FIGS. 5 and 6 represent the attenuation or the amplification of said at least one primary signal and/or said at least one secondary signal via said at least one first secondary trim input 147 and/or said at least one second secondary trim input 148.
Figure 6:
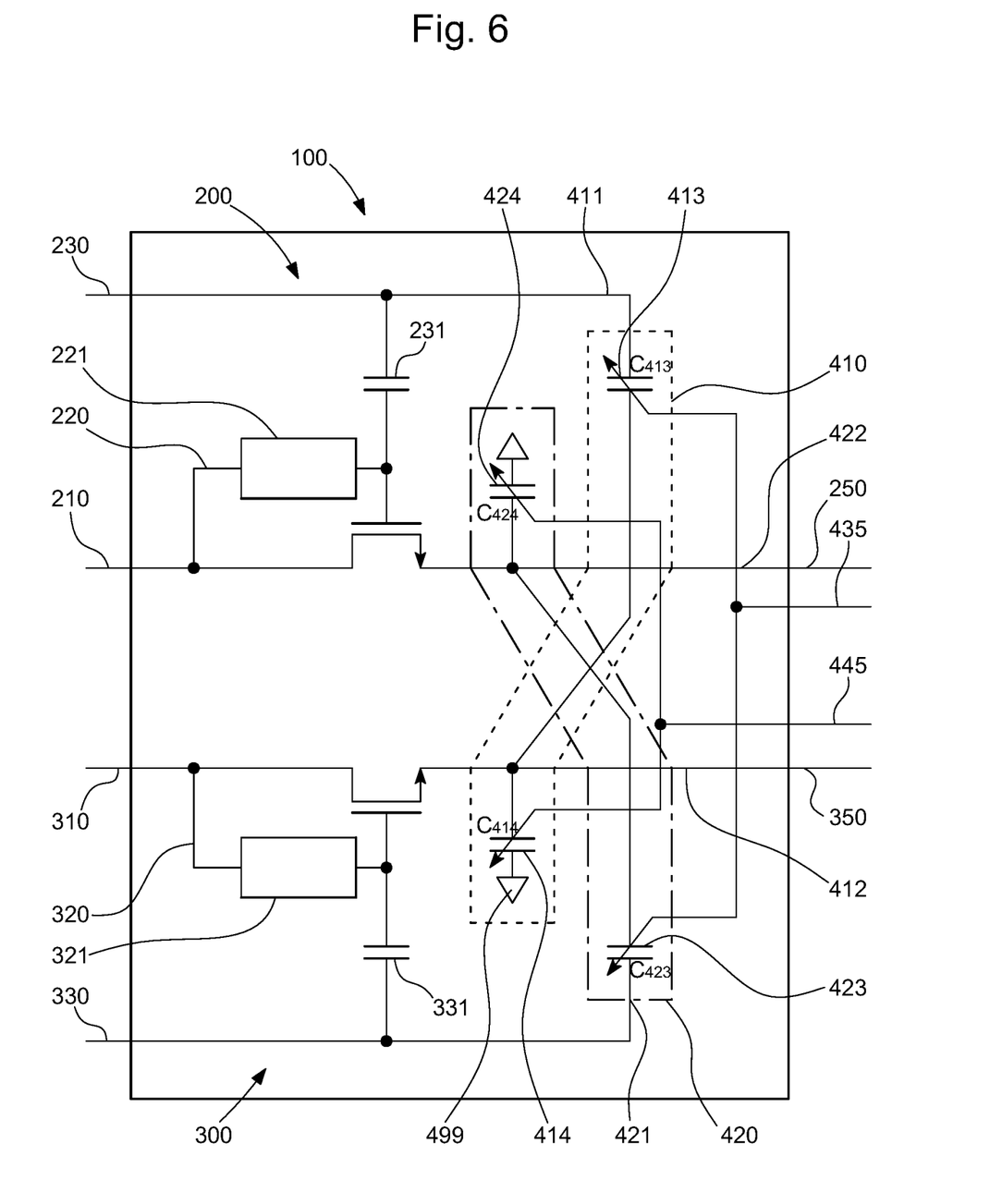

As shown FIGS. 5 and 6, said at least one primary attenuator 410 may comprise at least one first primary capacitor 413 connected between said at least one primary attenuator input 411 and said at least one primary attenuator output 412, and at least one second primary capacitor 414 connected between said at least one primary attenuator output 412 and said ground 499. In other side, said at least one secondary attenuator 420 may comprise at least one first secondary capacitor 423 connected between said at least one secondary attenuator input 421 and said at least one secondary attenuator output 422, and at least one second secondary capacitor 424 connected between said at least one secondary attenuator output 422 and said ground 499.

In order to control the K factor and thus the attenuation and amplification of said at least one primary signal and/or said at least one secondary signal, the value or values of said at least one first primary capacitor 413, said at least one second primary capacitor 414, said at least one first secondary capacitor 423 and/or said at least one second secondary capacitor 424 may be trimmed via at least one primary trim input 445 and/or at least one secondary trim input 435. Indeed, since it exists an optimal k-factor for each process and temperature, said at least one primary attenuator 410 and/or said at least one secondary attenuator 420 may be trimmed such as to attenuate or amplify said at least one primary signal and/or said at least one secondary signal and thus the charge pump converter stage efficiency may be maximized over process and temperature.

In order to attenuate or amplify said at least one primary signal and/or said at least one secondary signal, said charge pump converter stage 100 may comprise at least one primary trim input 445 configured to trim said at least one primary attenuator 410 and/or said at least one secondary attenuator 420. It may be also possible that said charge pump converter stage 100 may comprise also at least one secondary trim input 435 configured to trim said at least one primary attenuator 410 and/or said at least one secondary attenuator 420 in order to achieve the attenuation or the amplification of said at least one primary signal and/or said at least one secondary signal.

So, the control on the K factor may be made by trimming the values of said at least one first primary capacitor 413, said at least one second primary capacitor 414, said at least one first secondary capacitor 423 and/or said at least one second secondary capacitor 424 in said charge pump converter stage 100. Indeed, since it exists an optimal k-factor for each process and temperature, the charge pump converter stage efficiency can be in this way maximized over process and temperature.

As it may be observed in FIGS. 5 and 6, said at least one primary trim input 445 may control the capacitance $C_{414}$ of said at least one second primary capacitor 414 and/or the capacitance $C_{424}$ of said at least one second secondary capacitor 424. Similarly, said at least one secondary trim input 435 may control the capacitance $C_{413}$ of said at least one first primary capacitor 413 and/or the capacitance $C_{423}$ of said at least one first secondary capacitor 423.

As example, the following formula describes a sinusoidal clock signal RFin(X) from said at least one first secondary signal input 330:

$$RFin(X) = RFin_{0-pk} \cdot \sin(2\pi ft)$$

X being the number of said gate controller 100, for example the third charge pump converter stage 100 would be written as follow: RFin(3).

Neglecting the stray capacitance, the input voltage of the third at least one primary gate controller 200 and at least one secondary gate controller 300, rather the voltage of said at least one second primary signal input 210, for example, could be written as:

$$OUT(3-1) = K \cdot (3-1) \cdot (2RFin_{0-pk} - V_{diode}) + K \cdot RFin_{0-pk} \cdot \sin(2\pi ft)$$

and the gate voltage on said primary gate 243 of the 3rd gate controller 100 is:

$$G(3) = vbias3 + RFin_{0-pk} \cdot \sin(2\pi ft)$$

Where K being an attenuation coefficient or an amplification coefficient of said at least one primary attenuator 410, as previously mentioned:

$$K = \frac{C_{243}}{C_{243} + C_{424}}$$

Further, as early mentioned, said at least one primary bias input 220 can be properly connected to a bias-reference external to the charge pump or alternatively to an internal node of the charge pump, or charge pump stages, as shown on FIGS. 2, 4 and 6, such that said at least one primary gate controller 200 is self-biased without using bias-reference external to the charge pump.

Figure 8:
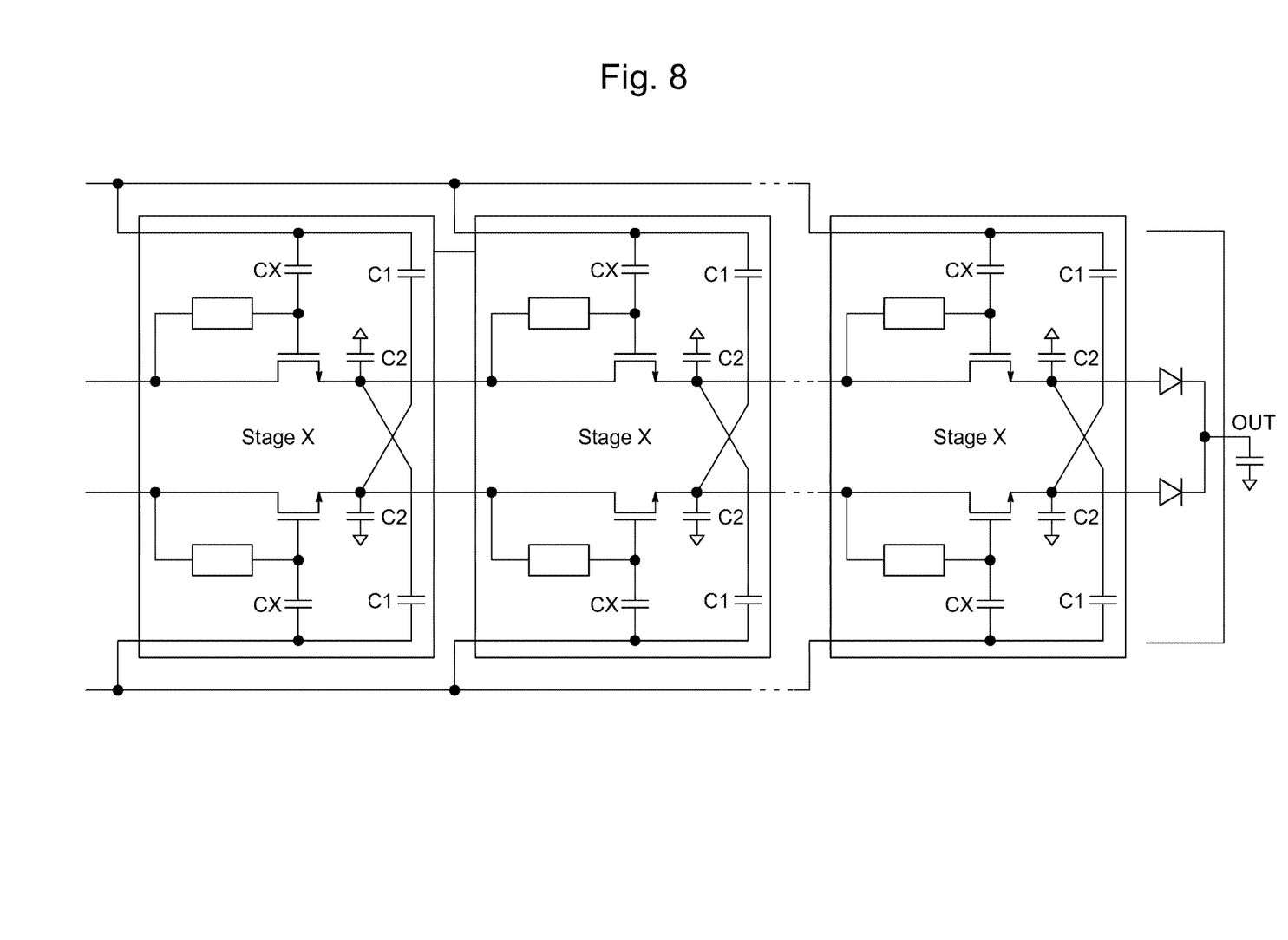

As shown in FIG. 8, a charge pump converter, according to another aspect of the invention, may comprise a plurality of charge pump converter stage 100 according to any precedent embodiment.

Said at least one primary gate controller 200 and said at least one secondary gate controller 300 are in differential and said at least one first primary signal input 230 of all charge pump converter stage 100 are connected to each other and said at least one first secondary signal input 330 of all charge pump converter stage 100 are also connected to each other, and said at least one second primary signal input 210 is connected to said at least one primary signal output 250 of a previous charge pump converter stage 100. The same applies for said at least one secondary gate controller 300, e.g. said at least one secondary signal output 350 is connected to an at least one second secondary signal input 310 of a previous charge pump converter stage 100.

Thanks to the arrangement according to the invention, the charge pump converter stage allows adjusting the bias voltage of the gate by coupling the gate of the switching element to the output of the previous charge pump converter stage and said at least one bias input, which sets the DC gate's voltage reference bias.

More specifically, the present invention comprises a gate controller having a primary signal input, a gate, one or more bias input each connected to the gate through a resistor or a transistor such as to control the DC voltage bias of the gate and therefore the conductivity of the switching element.

Said bias inputs can be properly connected to internal nodes of the charge pump, charge pump stage, or charge pump converter stage, such that the gate controller is self-biased without using bias-reference external to the charge pump.

The invention claimed is:

1. Charge pump converter stage comprising at least one primary gate controller and at least one secondary gate controller; said at least one primary gate controller comprises at least one:
   primary signal output: said at least one primary signal output is configured to be connected to an at least one second primary signal input of said charge pump converter stage and/or a first circuit;
   first primary signal input: said at least one first primary signal input is configured to receive a first control signal;
   primary bias input: said at least one primary bias input configured to establish a voltage value and/or a current value of said at least one primary gate controller;
   second primary signal input: said at least one second primary signal input configured to be connected to an at least one primary signal output of said charge pump converter stage and/or to receive said main signal, preferably from an antenna, from an integrated circuit, at least one primary signal and/or from a charge pump converter stage; and, said at least one secondary gate controller comprises at least one:
   secondary signal output: said at least one secondary signal output is configured to be connected to an at least one second secondary signal input of said charge pump converter stage and/or a second circuit;

first secondary signal input: said at least one first secondary signal input is configured to receive a second control signal;

secondary bias input: at least one secondary bias input configured to establish a voltage value and/or a current value of said at least one secondary gate controller; and, second secondary signal input: said at least one second secondary signal input configured to be connected to an at least one secondary signal output of a charge pump converter stage and/or to receive a main signal, preferably from an antenna, from an integrated circuit, at least one secondary signal and/or from said charge pump converter stage;

said at least one first primary signal input is configured to be connected to said at least one secondary signal output and said at least one first secondary signal input is configured to be connected to said at least one primary signal output, wherein the charge pump converter stage further comprises at least one primary attenuator including at least one primary attenuator input, at least one primary attenuator output and a ground.

2. Charge pump converter stage according to claim 1, wherein said at least one primary attenuator input is configured to be connected to said at least one first primary signal input and said at least one primary attenuator output is configured to be connected to said at least one secondary signal output.

3. Charge pump converter stage according to claim 1, which comprises at least one secondary attenuator; said at least one secondary attenuator comprises at least one secondary attenuator input, at least one secondary attenuator output and a ground.

4. Charge pump converter stage according to claim 3, wherein said at least one secondary attenuator input is configured to be connected to said at least one first secondary signal input and said at least one secondary attenuator output is configured to be connected to said at least one primary signal output.

5. Charge pump converter stage according to claim 1, which comprises at least one primary trim input configured to trim said at least one primary attenuator and/or said at least one secondary attenuator, and/or at least one secondary trim input configured to trim said at least one primary attenuator and/or said at least one secondary attenuator.

6. Charge pump converter stage according to claim 5, wherein said at least one primary attenuator comprises at least one first primary capacitor connected between said at least one primary attenuator input and said at least one primary attenuator output, and at least one second primary capacitor connected between said at least one primary attenuator output and said ground, and/or said at least one secondary attenuator comprises at least one first secondary capacitor connected between said at least one secondary attenuator input and said at least one secondary attenuator output, and at least one second secondary capacitor connected between said at least one secondary attenuator output and said ground.

7. Charge pump converter stage according to claim 6, wherein said at least one primary trim input is configured to control the capacitance of said at least one second primary capacitor and/or the capacitance of said at least one second secondary capacitor.

8. Charge pump converter stage according to claim 6, wherein said at least one secondary trim input is configured to control the capacitance of said at least one first primary capacitor and/or the capacitance of said at least one first secondary capacitor.

9. Charge pump converter stage according to claim 1, wherein said at least one primary gate controller comprises at least one primary switching element having a primary conduction path with a first primary terminal and a second primary terminal, and a primary gate configured to control the current flowing through said primary conduction path, said primary conduction path being configured to provide said at least one primary signal; said primary gate is configured to be connected to said at least one first primary signal input and to said at least one primary bias input, and/or wherein said at least one secondary gate controller comprises at least one secondary switching element having a secondary conduction path with a first secondary terminal and a second secondary terminal, and a secondary gate configured to control the current flowing through said secondary conduction path, said secondary conduction path being configured to provide said at least one secondary signal; said secondary gate is configured to be connected to said at least one first secondary signal input and to said at least one secondary bias input.

10. Charge pump converter stage according to claim 1, wherein said at least one primary bias input is configured to be connected to said at least one second primary signal input, and/or said at least one secondary bias input is configured to be connected to said at least one second secondary signal input.

11. Charge pump converter comprising a plurality of charge pump converter stages including at least one first charge pump converter stage according to claim 1, and a second charge pump converter stage according to claim 1; said at least one first primary signal input of said at least one first charge pump converter stage is directly connected to said at least one first primary signal input of said at least one second charge pump converter stage, said at least one first secondary signal input of said at least one first charge pump converter stage is directly connected to said at least one first secondary signal input of said at least one second charge pump converter stage, said at least one primary signal output of said at least one first charge pump converter stage is directly connected to said at least one second primary signal input of said at least one second charge pump converter stage, said at least one secondary signal output of said at least one first charge pump converter stage is directly connected to said at least one second secondary signal input of said at least one second charge pump converter stage.

* * * * *